(12) United States Patent
Aoya et al.

(10) Patent No.: US 8,815,648 B1
(45) Date of Patent: Aug. 26, 2014

(54) MULTI-STEP SINTERING OF METAL PASTE FOR SEMICONDUCTOR DEVICE WIRE BONDING

(71) Applicant: Texas Instruments Incorporated, Dallas, TX (US)

(72) Inventors: Kengo Aoya, Hayami-Gun (JP); Shohta Ujiie, Hayami-Gun (JP); Kazunori Hayata, Hayami-Gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/854,400

(22) Filed: Apr. 1, 2013

(51) Int. Cl.
*H01L 29/66* (2006.01)
*H01L 23/00* (2006.01)

(52) U.S. Cl.
CPC .............. *H01L 24/85* (2013.01); *H01L 24/89* (2013.01)
USPC ........... 438/123; 438/112; 438/125; 438/127; 438/612; 438/613

(58) Field of Classification Search
None
See application file for complete search history.

(56) References Cited

U.S. PATENT DOCUMENTS

| 5,587,111 A | 12/1996 | Watanabe et al. |
| 2007/0098883 A1* | 5/2007 | Itoh et al. ............. 427/180 |
| 2010/0055302 A1 | 3/2010 | Kim et al. |
| 2012/0211889 A1 | 8/2012 | Edwards et al. |

OTHER PUBLICATIONS

Zvi Yaniv, "Nanotechnology and Its Contribution to Technical Inks for Printed Electronics", Applied Nanotech, Inc., Eurodisplay 2009, Aug. 2009, pp. 1-4.
Tomotake Niizeki, et al., "Laser Sintering of Ag Nanopaste Film and Its Application to Bond-Pad Formation", 2008 Electronic Components and Technology Conference, May 27-30, 2008, pp. 1745-1750.

* cited by examiner

*Primary Examiner* — Kyoung Lee
(74) *Attorney, Agent, or Firm* — Steven A. Shaw; Frederick J. Telecky, Jr.

(57) ABSTRACT

A method of assembling semiconductor devices includes applying a metal paste including a plurality of metal particles having an average size less than 50 nanometers and a binder material onto a metal terminal of a package substrate. The metal paste is processed including a heat up step in a reducing gas atmosphere and then a vacuum sintering step at a temperature of at least 200° C. for forming a sintered metal coating. A semiconductor die is attached onto a die attach area of the package substrate. A bond wire is then connected between a bond pad on the semiconductor die and the sintered metal coating on the metal terminal.

14 Claims, 2 Drawing Sheets

MULTI-STEP SINTERING OF METAL PASTE FOR SEMICONDUCTOR DEVICE WIRE BONDING

FIELD

Disclosed embodiments relate to methods for producing metal materials from a metal paste for improved bond strength for wire bonded semiconductor devices.

BACKGROUND

In the manufacture of semiconductor integrated circuits (ICs), semiconductor IC die (or chips) are commonly mounted on a leadframe, followed by enclosing the IC die and part of the leadframe in a plastic casing to form an IC package. The IC package can be mounted on a printed circuit board (PCB) for interconnection with external circuitry. A leadframe should provide good bondability, molding compound characteristic, and solderability, so that it can facilitate the packaging process. To provide these characteristics, various coatings may be formed on the leadframe surface, which typically comprises a copper or a copper alloy base material. A conventional method for providing improved bondability for the interconnection between bond wires and the bonding areas of a leadframe is to electroplate a metal such as silver (Ag) on the bonded areas including on the surface of the metal terminals (e.g., copper terminals) within the package before wire bonding. It is also known to form a sintered metal material on the bonded areas of the metal terminals by sintering a deposited metal paste before wire bonding.

Wire bonding is then generally performed by a first bonding which forms a ball bond by placing a capillary over the bond pad (or die pad) of the IC die with a ball of the wire extending out of the capillary, and then a second bonding for bonding to the metal terminal. In the second bonding the capillary may be moved to a metal terminal (e.g., lead finger which as noted above can include a plated metal layer or a sintered metal material thereon) of the leadframe to which a second bond is made with the wire travelling with respect to the capillary bore, and a stitch bond can be made to the metal terminal (e.g., lead finger) using the capillary with the wire then being broken, leaving a small wire pigtail extending out of the capillary.

Wire bonding can also be used to bond a semiconductor die to a variety of package substrates other than leadframes. For example, package substrates can include printed circuit boards (PCBs) including multi-layer PCBs, thick film ceramics, glass substrates and flexible circuits.

Metal pastes are conventionally sintered in a cure oven to remove the binder (and solvent if present) and to densify (reducing the porosity) of the metal material. One known process for producing a sintered metal material comprises providing a copper paste including a binder and a plurality of copper nanoparticles, and then heat treating the metal paste in a non-oxidizing atmosphere, such in $N_2$ or an inert gas at a peak temperature of about 150° C. to 300° C. to remove the binder.

In the case of wire bonded devices having wire bonds to a sintered metal material on a metal terminal of a package substrate, however, there can be a problem with weak wire bond connections and resulting instability of the wire bonds to the metal terminals. Weak wire bond wire connections can cause high resistance contacts and low pull strength of the wire bond leading to pulling apart. Conventional solutions to this problem include modifying the metal paste formulation (composition), applying a radio frequency (RF) plasma to the metal paste in the sintering cure oven, and applying mechanical pressure to the metal paste, which can each reduce porosity and thus increase the density of the sintered metal material by a modest amount.

SUMMARY

Disclosed embodiments recognize weak wire bond connections between bond pads on a semiconductor die and sintered metal material on metal terminals of a package substrate can be due to significant porosity of the sintered metal material. Weak bond wire connections can lead to failures including electrical instabilities resulting from high resistance contacts (adding significant series resistance) and mechanical failures due to low pull strength leading to pulling apart of the bond wire connection.

For example, sintered metal pastes, including sintered silver pastes and sintered copper pastes, have been found to remain significantly porous after conventional metal paste sintering processes (e.g., a single step in $N_2$ or an inert gas at a peak temperature of about 150° C. to 300° C.). Disclosed embodiments solve this problem of weak wire bond connections by multi-step sintering of metal pastes including a heat up step in a reducing gas atmosphere and then a vacuum sintering step at a temperature of at least 200° C. for forming a sintered metal coating. Disclosed multi-step sintering has been found to significantly reduce the porosity and increase the density of the sintered metal paste, thus increasing the bond strength of the wire bond to the metal terminal.

Reducing gases including reducing gas mixtures such as forming gas ($N_2$ and $H_2$) are recognized herein to substantially reduce or eliminate oxides on the surface of metals, such as copper oxide on the surface in the case of copper nanoparticles, not just prevent oxidation that ambients such as $N_2$ and inert gases can provide. Oxide reduction or elimination before sintering provided by reducing gas treatments together with the recognition metal nanoparticles sinter at temperatures well below the melting point temperature of the corresponding bulk metal material provided the surface oxide layer is removed, allows the size dependence of the melting point of nanometals to be exploited by disclosed sintering methods. This recognition enables disclosed multi-step sintering including a reducing gas treatment then sintering to reduce the porosity of the resulting sintered metal material with the metal particles combining with one another to increase the grain size, and as a result the density of the sintered metal material to be increased. During the crystal growth process during sintering smaller grains can combine with adjacent smaller grains to form larger secondary grains, despite the sintering temperature used to be well below the melting point of the corresponding bulk metal material. Disclosed sintered metal materials enable higher wire bond performance, including improved wire bond ability, and higher pull strength, shear strength and break mode performance.

BRIEF DESCRIPTION OF THE DRAWINGS

Reference will now be made to the accompanying drawings, which are not necessarily drawn to scale, wherein.

DETAILED DESCRIPTION

Figure 1:
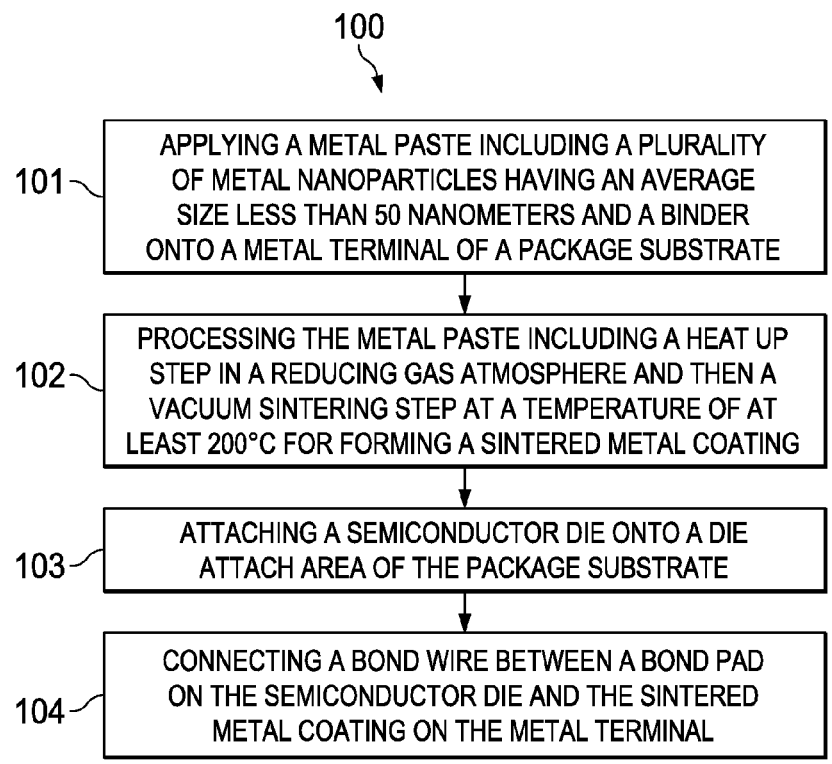
FIG. 1 is a flow chart that shows steps in an example method of assembling semiconductor devices including multi-step sintering of a metal paste on a metal terminal including a heat up step in a reducing gas environment then vacuum sintering, followed by bonding a bond wire from the semiconductor die to the sintered metal paste, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of assembling semiconductor devices including multi-step sintering of a metal paste on a metal terminal including a heat up step in a reducing gas environment then vacuum sintering, followed by bonding a bond wire from the semiconductor die to the sintered metal paste, according to an example embodiment. Disclosed embodiments recognize to achieve significant metal sintering well below the melting point temperature of the corresponding bulk metal material to enable use of a variety of different package substrates, the size dependence of the melting point of nanometals can be exploited, provided the surface oxide is first reduced (removed) by a reducing gas. The size dependency of a nanoparticle melting point for a given material generally shows a monotonic decrease with decreasing size, which allows sintering of metal nanoparticles by reducing gas treatment at temperatures well below the melting point temperature of the corresponding bulk metal material, such as at 250° C. to 400° C. for copper nanoparticles when the melting point temperature of the corresponding bulk copper material is around 1083° C.

Step 101 comprises applying a metal paste including a plurality of metal nanoparticles having an average size less than 50 nanometers and a binder onto a metal terminal of a package substrate. As used herein, a binder is a material for dispersing the metal particles in the paste, and to enable printing of the metal particles. The binder is generally an organic binder. As known in the art, the binder can be a solvent-binder, or a separate solvent may be added.

The package substrate can comprise a variety of package substrates, including metallic frames to form leadless packages having internal terminals comprising lead fingers and leaded packages where the plurality of metal terminals comprise a plurality of leads (or pins) including an internal lead portion and an external lead portion. The metal terminal can include a top surface having a first composition, and the sintered metal coating can comprise a second composition different from the first composition. Disclosed package substrates can also include, for example, printed circuit boards (PCBs) such as multi-layer PCBs, thick film ceramics, glass substrates and flexible substrates including tapes. However, the substrate material should be selected to provide temperature tolerance in view of the maximum sintering temperature used. For example, the glass transition temperature ($T_G$) of most polymer substrates is ≤250° C.

The applying can comprise ink-jet printing, screen printing or dispensing. A computer controlled ink jet apparatus can be used in one particular embodiment. The dispensing apparatus can include computer controlled needle dispensers (air, mechanical) and jet dispensers. These methods all dispense metal particles in a metal paste, and can print a paste with high resolution. In the case of ink-jet printing, the ink-jet printing action can be induced by various technologies known in the art, including piezoelectric or thermal ink jet printers. Ink-jet printing operates via a series of nozzles to shoot small droplets of liquid onto a surface with high precision. The nozzles are part of a print head that can be moved back and forth (e.g., by a stepper motor) with respect to the surface being printed. The surface being printed can also be moved relative to the print head.

Step 102 comprises processing the metal paste including a heat up step in a reducing gas atmosphere and then a vacuum sintering step at a temperature of at least 200° C. for forming a sintered metal coating. A "reducing gas" as used herein is a gas or gas mixture capable of generating H* radicals or H$^+$ ions through decomposition or dissociation. The reducing gas can include one or more of hydrazine ($N_2H_4$) derivatives, $NH_3$, $H_2$, $SiH_4$ and $Si_2H_6$. In one particular embodiment, the reducing gas is a gas mixture, such as forming gas ($N_2+H_2$) which is a mixture of $H_2$ and $N_2$ where the respective mole fractions can vary. Reducing gases, such as forming gas, are recognized herein to reduce oxides on the metal surface, such as copper oxide in the case of copper nanoparticles.

The heating can comprise ramped heating before the vacuum sintering step at atmospheric pressure. In one embodiment the sintered metal coating comprises nanoparticles comprising copper or aluminum and the temperature of the vacuum sintering step is between 250 and 400° C. The vacuum sintering step is generally performed without flowing any gas, where a minimum vacuum level during the vacuum sintering step is generally below 100 Pa, such as 5 to 50 Pa. The method can also comprise a cooling step after the vacuum sintering step in a reducing gas atmosphere with a pressure increasing with time to reach an atmospheric pressure. The heat up step and the cooling step can both utilize forming gas in one particular embodiment.

The thickness of metal paste as applied can be at least 1 μm, typically in a thickness range between 2 μm and 8 μm. The metal nanoparticles in the metal paste can comprise silver, copper, aluminum or gold, or alloys thereof.

Step 103 comprises attaching a semiconductor die onto a die attach area of the package substrate. The semiconductor die may be attached to the die attach area by a die attach adhesive, such as to a die pad of a leadframe. The top side surface of the semiconductor die is an active surface (e.g., silicon surface) which generally includes a plurality of interconnected devices that include transistors and other circuit elements configured together to provide a function.

Step 104 comprises connecting a bond wire between a bond pad on the top side surface of the semiconductor die and the sintered metal coating on the metal terminal. The metal terminals can be standard metal terminals (e.g., copper), or be plated metal terminals. In the case the package substrate is a leadframe, the semiconductor die is attached to the die pad of a leadframe and the bond wire from the bond pad of the die is bonded to a bonded area within a metal terminal outside the die pad of the leadframe. The leadframe generally includes a plurality of metal terminals.

In the bonding process, a plurality bond wires, such as gold or aluminum wires, each having one end bonded to a bonding pad on the semiconductor die and the other end bonded to the metal terminals (e.g., internal leads for a leaded package), are used for the interconnect. Known wire bonding techniques may be used. For example, a stitch bond may be formed along a bonding interface between the bond wire and the bonded area of the metal terminal under bond wire. The bondwire material may comprise a variety of materials, including Au, Cu, or Al.

In the case the package substrate comprises a leadframe, step 105 comprises encapsulating the semiconductor device in an encapsulating material, such as a polymer. An electrically non-conducting (dielectric) encapsulation polymer can be molded over the package in the encapsulation step. The packaged semiconductor device is then generally electrically tested.

As described above, disclosed methods of assembling semiconductor devices can utilize package substrates other than leadframes, including PCBs, thick film ceramics, glass substrates, and flexible substrates including tapes. The package substrate can also comprise leadframe substitutes including dummy plates and removable metal. In case the leadframe substitute is a dummy plate or removable metal, the package substrate may have the ability to be removed after molding process. Fabrication methods for semiconductor packaged devices are known which eliminate the relatively costly leadframe and replace it by a more cost effective substitute.

For example, this method can comprise applying a metal paste including a binder material (e.g., a liquid) on a carrier board to form short, lead-like stripes. This step is followed by disclosed multi-step sintering of the metal paste including a heat up step in a reducing gas environment then vacuum sintering, with the sintering of the metallic particles within each stripe at a temperature below the melting temperature of the metallic particles. Even though the particles remain in their solid state, they can coalesce to grow into contiguous solid regions forming metallic structures suitable for replacing traditional lead frames and for the process of thermosonic wire bonding using metals such as gold or copper. As an example, silver powders in organic suspension vehicles can be used to be fired in disclosed methods at maximum temperatures between 250° C. and 400° C. to create surfaces suitable for high yield wire bonding. During firing, the suspension vehicle materials burn away, leaving essentially no ash, and the silver powder sinters to a high density metal mass. The carrier board may be stainless steel in one embodiment which can be peeled away easily after molding leaving a surface that is clean and ready for soldering.

Figure 2:
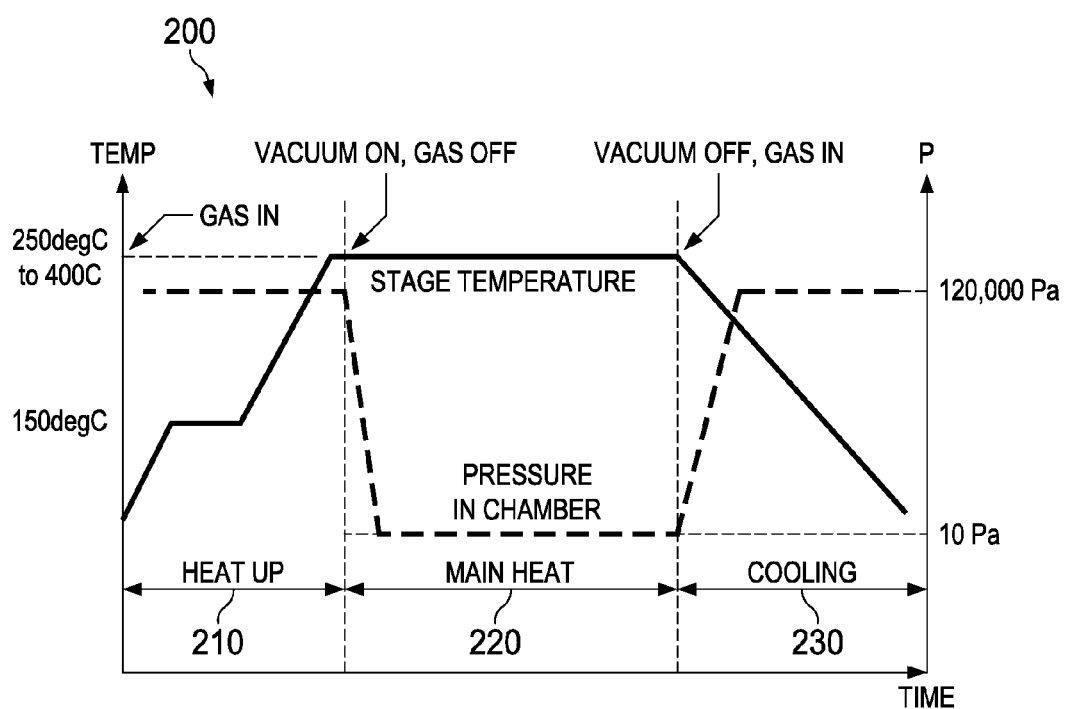
FIG. 2 is an example temperature and pressure profile vs. time for an example multi-step metal paste sintering method, according to an example embodiment.

FIG. 2 is a temperature and pressure profile for an example multi-step sintering/cure process 200, according to an example embodiment. The package substrate including a metal paste on its metal terminals is placed in a curing oven. When the package substrate comprises a leadframe, a leadframe sheet including a plurality of interconnected leadframes is generally placed into the curing oven.

Step 210 comprises a heat up step in a reducing gas atmosphere. For example, forming gas can be used to reduce (i.e., remove) the oxidation on the surface of the metal nanoparticles (e.g., copper oxide in the case of copper nanoparticles), and then prevent oxidation. This step can be performed at atmospheric pressure (about 120 kPa).

Step 220 comprises a vacuum sintering step 220 at a temperature of at least 200° C. for forming a sintered metal coating. The vacuum level shown in FIG. 2 for example at 10 Pa helps to accelerate the vaporization of the binder material (e.g. organic material) and a solvent if present. Circulation can be used to further accelerate vaporizing the binder material. FIG. 2 shows an example temperature of 250° C. to 400° C. for the vacuum sintering step 220. The time for the vacuum sintering step 220 can be 5 to 30 minutes, for example. All gases are shut off during the vacuum sintering step 220.

Step 230 comprises a cooling step in a reducing gas atmosphere with a pressure increasing with time to reach atmospheric pressure. The reducing gas atmosphere, such as using forming gas, reduces any surface oxide if present and prevents the oxidation of the sintered metal surface.

Figure 3A:
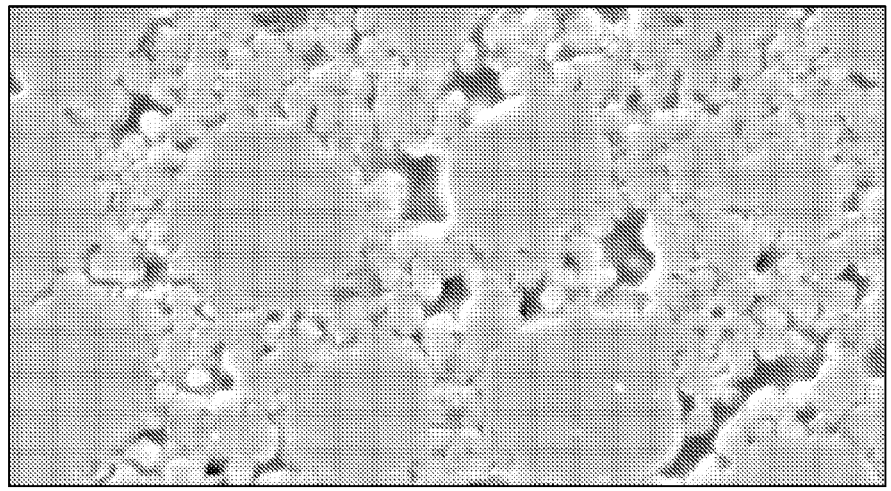
FIG. 3A is a scanned scanning electron microscope (SEM) image of a sintered copper coating following conventional cure oven sintering.
Figure 3B:
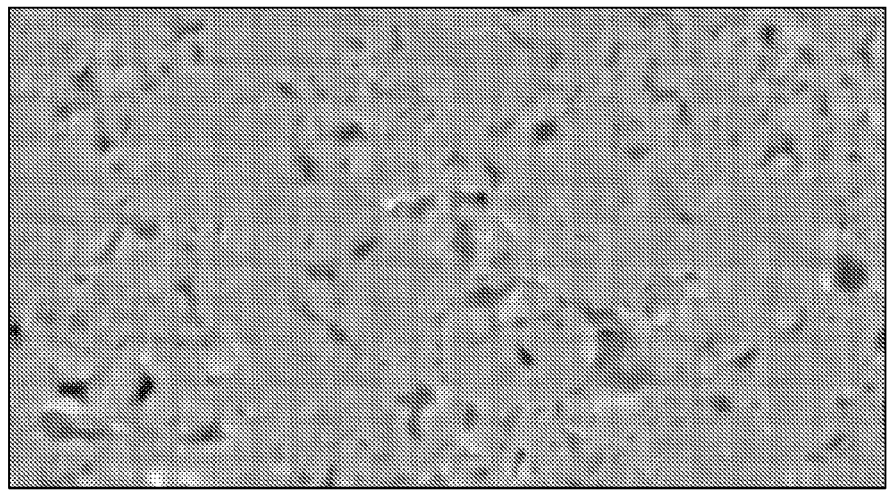
FIG. 3B is a scanned SEM image of a sintered copper coating following an example cure oven multi-step sintering, according to an example embodiment.

FIG. 3A is a scanned SEM image of a sintered copper coating following conventional cure oven sintering (250° C. for 10 min). FIG. 3B is a scanned SEM image of a sintered copper coating following a disclosed cure oven sintering comprising the temperature and pressure profile for the example multi-step sintering/cure process 200 shown in FIG. 2. The porosity of the sintered copper in FIG. 3B can be seen to be significantly less (and the density significantly higher) as compared to the porosity (and density) of the sintered copper shown in FIG. 3A.

Disclosed embodiments solve the problem of low density sintered metal paste which can result in the breaking of the wire bond by pressure without the need for plasma sintering that is high cost and where the point (focused region) of the plasma irradiation reaches a high temperature which can cause problems, or the need for applying mechanical pressure. Another problem solved is penetration of liquid dielectric material when molding in the case of molded leadframe packages. If a solder connection is needed at the bottom of the package, mold material penetration can cause non-wet solder which can lead to open circuit failures in the application (e.g., at the customer).

Disclosed embodiments be integrated into a variety of assembly flows to form a variety of different semiconductor IC devices and related products. The assembly can comprise single semiconductor die or multiple semiconductor die, such as PoP configurations comprising a plurality of stacked semiconductor die. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of assembling semiconductor devices, comprising:
    applying a metal paste including a plurality of metal nanoparticles having an average size less than 50 nanometers and a binder material onto a metal terminal of a package substrate;
    processing said metal paste including a heat up step in a reducing gas atmosphere and then a vacuum sintering step at a temperature of at least 200° C. for forming a sintered metal coating;
    attaching a semiconductor die onto a die attach area of said package substrate, and
    connecting a bond wire between a bond pad on said semiconductor die and said sintered metal coating on said metal terminal.

2. The method of claim 1, wherein said heat up step comprises ramped heating before said vacuum sintering step at atmospheric pressure, further comprising a cooling step after said vacuum sintering step in a reducing gas atmosphere with a pressure increasing with time to reach an atmospheric pressure.

3. The method of claim 1, wherein said vacuum sintering step is performed without flowing any gas, wherein a minimum vacuum level during said vacuum sintering step is below 100 Pa.

4. The method of claim 1, wherein said applying comprises inkjet dispensing.

5. The method of claim 1, wherein said metal terminal includes a top surface having a first composition, and wherein said sintered metal coating comprises a second composition different from said first composition.

6. The method of claim 1, wherein said sintered metal coating comprises particles comprising copper or aluminum and said temperature of said vacuum sintering step is between 250° C. and 400° C.

7. The method of claim 1, wherein a thickness of said sintered metal coating is from 2 μm to 8 μm.

8. The method of claim 1, wherein a bond formed between said bond wire and said sintered metal coating comprises a stitch bond.

9. The method of claim 1, wherein said package substrate comprises a leadframe, wherein a bottom side surface of said semiconductor die is attached to a die pad of said leadframe.

10. The method of claim 2, wherein said heat up step and said cooling step both utilize forming gas.

11. A method of assembling semiconductor devices, comprising;
    applying a metal paste including a plurality of copper nanoparticles having an average size less than 50 nanometers and a binder material onto a metal terminal of a leadframe;
    processing said metal paste including a heat up step in a reducing gas atmosphere and then a vacuum sintering step at a temperature of at least 200° C. for forming a sintered metal coating, and a cooling step after said vacuum sintering step in a reducing gas atmosphere with a pressure increasing with time to reach an atmospheric pressure;
    attaching a semiconductor die onto a die pad of said leadframe, and
    connecting a bond wire between a bond pad on said semiconductor die and said sintered metal coating on said metal terminal.

12. The method of claim 11, wherein said vacuum sintering step is performed without flowing any gas, wherein a minimum vacuum level during said vacuum sintering step is below 100 Pa.

13. The method of claim 11, wherein said heat up step and said cooling step both utilize forming gas.

14. The method of claim 11, wherein said temperature of said vacuum sintering step is between 250° C. and 400° C.

* * * * *